United States Patent
Benzreba et al.

(10) Patent No.: US 7,369,066 B1
(45) Date of Patent: May 6, 2008

(54) EFFICIENT 8×8 CABAC RESIDUAL BLOCK TRANSCODE SYSTEM

(75) Inventors: Jamal Benzreba, Kitchener (CA); Harminder Banwait, Waterloo (CA); Eric Pearson, Conestogo (CA)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 11/643,642

(22) Filed: Dec. 21, 2006

(51) Int. Cl.
*H03M 7/34* (2006.01)
*H03M 7/38* (2006.01)

(52) U.S. Cl. .............................. 341/51; 341/65; 341/67; 341/107; 375/240.02; 375/240.21; 375/240.23; 375/240.24; 382/239; 382/244; 382/245; 382/246; 382/247

(58) Field of Classification Search ...................... None
See application file for complete search history.

(56) References Cited

U.S. PATENT DOCUMENTS

| | | | |
|---|---|---|---|
| 6,653,955 B1 * | 11/2003 | Yang ............................ | 341/67 |
| 6,917,310 B2 * | 7/2005 | Pearson et al. ............... | 341/50 |
| 7,026,961 B2 * | 4/2006 | Pearson et al. ............... | 341/50 |
| 7,061,410 B1 * | 6/2006 | Pearson et al. ............. | 341/107 |
| 7,245,242 B2 * | 7/2007 | Hu et al. .................... | 341/107 |

* cited by examiner

*Primary Examiner*—Khai M. Nguyen
(74) *Attorney, Agent, or Firm*—Christopher P. Maiorani P.C.

(57) ABSTRACT

A circuit generally including a first module, a second module and a third module is disclosed. The first module may be configured to (i) generate a plurality of parsed residual blocks by parsing a plurality of 4×4 CAVLC (context-based adaptive variable length coding) residual blocks received in an input signal and (ii) generate a plurality of metric signals resulting from the parsing of the 4×4 CAVLC residual blocks. The second module configured to generate a plurality of scanning position signals based on the metric signals. The third module configured to generating an 8×8 CABAC (context-based adaptive binary arithmetic coding) residual block in an output signal by up-sampling the parsed residual blocks based on the scanning position signals.

20 Claims, 8 Drawing Sheets

US 7,369,066 B1

EFFICIENT 8×8 CABAC RESIDUAL BLOCK TRANSCODE SYSTEM

CROSS REFERENCE TO RELATED APPLICATIONS

The present application may relate to co-pending application Ser. No. 11/643,643, filed Dec. 21, 2006, which is hereby incorporated by reference in its entirety.

FIELD OF THE INVENTION

The present invention relates to video processing generally and, more particularly, to an efficient 8×8 CABAC residual block transcode system.

BACKGROUND OF THE INVENTION

A device compatible with the High 10 profile of the H.264 video recommendation must be capable of encoding an 8×8 CABAC residual block of transform coefficient levels. In order to encode an H.264 High 10 profile bitstream, four 4×4 CAVLC residual blocks of transform coefficient levels must be transcoded into a 8×8 CABAC residual block.

Conventional approaches perform the 8×8 CABAC residual block transcoding using software. However, a software solution incurs latency and thus experiences a loss of performance.

It would be desirable to implement a system for an efficient 8×8 CABAC residual block encode that does not suffer such loss of performance typically associated with software implementations.

SUMMARY OF THE INVENTION

The present invention concerns a circuit generally comprising a first module, a second module and a third module. The first module may be configured to (i) generate a plurality of parsed residual blocks by parsing a plurality of 4×4 CAVLC (context-based adaptive variable length coding) residual blocks received in an input signal and (ii) generate a plurality of metric signals resulting from the parsing of the 4×4 CAVLC residual blocks. The second module configured to generate a plurality of scanning position signals based on the metric signals. The third module configured to generating an 8×8 CABAC (context-based adaptive binary arithmetic coding) residual block in an output signal by up-sampling the parsed residual blocks based on the scanning position signals.

The objects, features and advantages of the present invention include providing an efficient 8×8 CABAC residual block transcode system that may (i) reduce a transcoding latency, (ii) maintain a performance and/or (iii) be implemented with minimal hardware.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
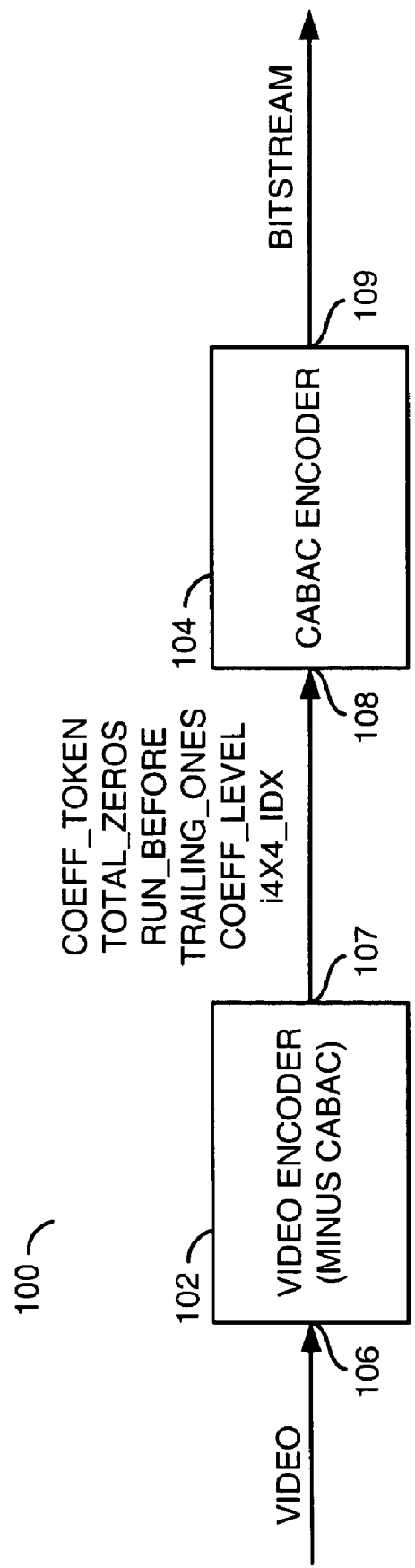
FIG. 1 is a block diagram of the present invention.

Referring to FIG. 1, a block diagram of a system 100 is shown in accordance with a preferred embodiment of the present invention. The system 100 generally comprises a block (or circuit) 102 and a block (or circuit) 104. In one example, the circuit 102 may be implemented as a video encoder circuit, without Context-based Adaptive Binary Arithmetic Coding (CABAC) circuitry. In one example, the circuit 104 may be implemented as a CABAC encoder circuit. The circuit 102 may have an input 106 that may receive an input signal (e.g., VIDEO). The signal VIDEO may be an uncompressed video signal. The circuit 102 may have an output 107 that may present a number of processed signals (e.g., COEFF_TOKEN, TOTAL_ZEROS, RUN_BEFORE, TRAILING_ONES, COEFF_LEVEL, and/or i4×4_IDX). The processed signals may convey CAVLC syntax elements. The circuit 104 may have an input 108 that may receive the processed signals. The circuit 104 may have an output 109 that may present a signal (e.g., BITSTREAM). The signal BITSTREAM may be a compressed video signal. The circuit 104 may generate the signal BITSTREAM in response to the processed signals generated by the circuit 102. The signal BITSTREAM may be compliant with the H.264 Recommendation, High 10 profile.

Figure 2:
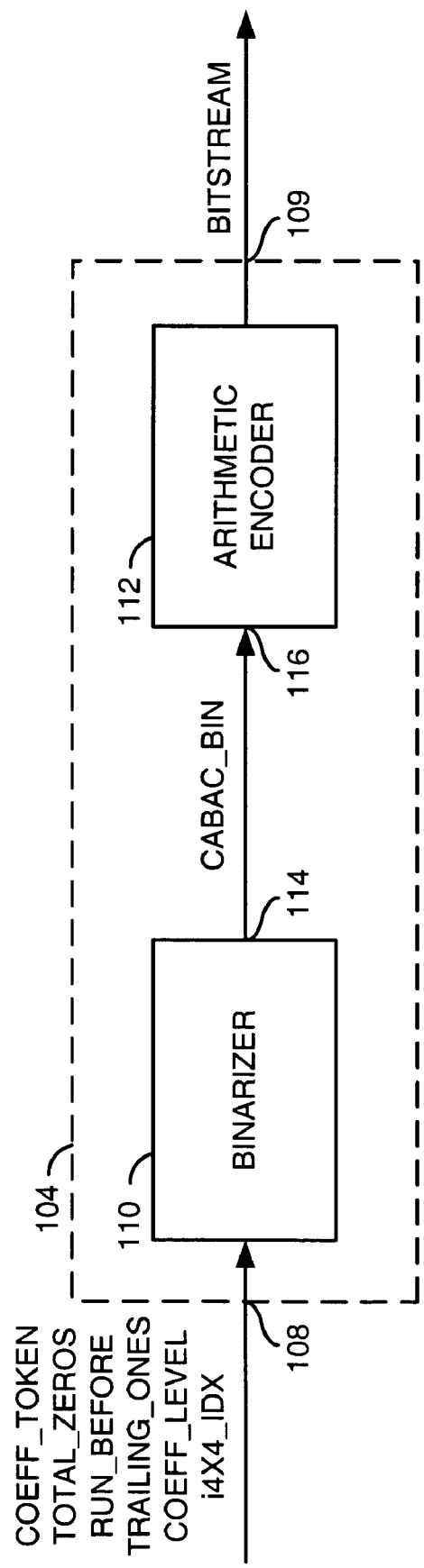
FIG. 2 is a more detailed block diagram of the encoder of FIG. 1.

Referring to FIG. 2, a more detailed diagram of the CABAC encoder circuit 104 is shown. The circuit 104 generally comprises a block (or circuit) 110 and a block (or circuit) 112. In one example, the circuit 110 may be implemented as binarizer circuit. In one example, the circuit 112 may be implemented as an arithmetic encoder circuit. The circuit 110 may generate a signal (e.g., CABAC_BIN) in response to the processed signals. The signal CABAC_BIN may be presented to an output 114. The circuit 112 may generate the signal BITSTREAM in response to the signal CABAC_BIN. The circuit 112 may have an input 116 that may receive the signal CABAC_BIN.

Figure 3:
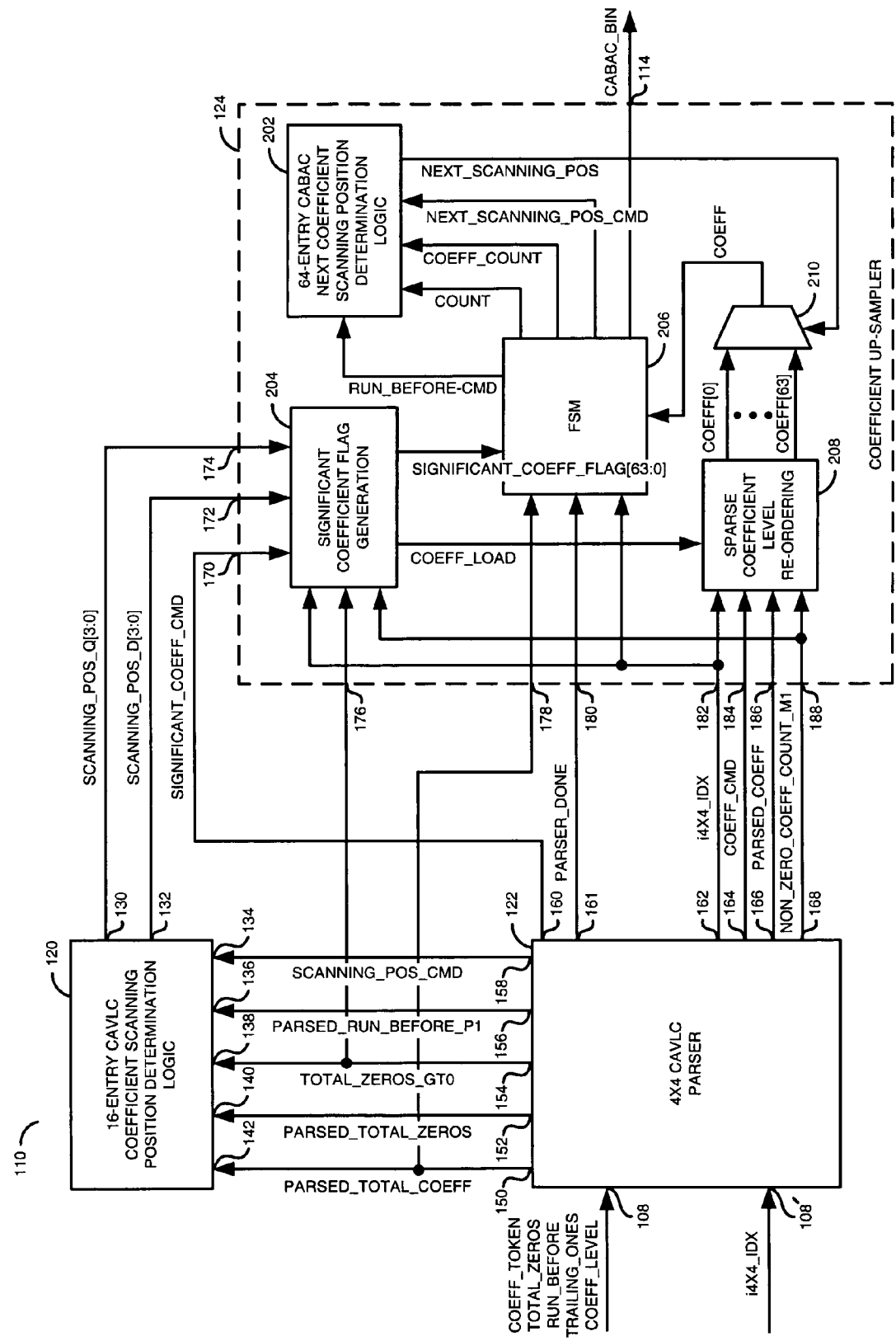
FIG. 3 is a more detailed block diagram of the binarization circuit of FIG. 2.

Referring to FIG. 3, a more detailed diagram of the binarizer circuit 110 is shown. The circuit 110 generally comprises a block (or circuit) 120, a block (or circuit) 122, and a block (or circuit) 124. The circuit 120 may be implemented as a logic circuit. In one example, the circuit 120 may be implemented as a 16-entry CAVLC coefficient scanning position determination logic circuit. In one example, the circuit 122 may be implemented as a parser circuit. In one implementation, the circuit 122 may be implemented as a 4×4 CAVLC parser circuit. In one example, the circuit 124 may be implemented as a sampler circuit. In one example, the circuit 124 may be implemented as a coefficient up-sampler circuit.

The circuit 120 may have an output 130 that may present a signal (e.g., SCANNING_POS_Q[3:0]), an output 132 that may present a signal (e.g., SCANNING_POS_D[3:0]), an input 134 that may receive a signal (e.g., SCANNING_POS_CMD), an input 136 that may receive a signal (e.g., PARSED_RUN_BEFORE_P1), an input 138 that may receive a signal (e.g., TOTAL_ZEROS_GT0), an input 140 that may receive a signal (e.g., PARSED_TOTAL_ZEROS), and an input 142 that may receive a signal (e.g., PARSED_TOTAL_COEFF).

The circuit 122 may have an input 108 that may receive the processed signals COEFF_TOKEN, TOTAL_ZEROS, RUN_BEFORE, TRAILING_ONES and COEFF_LEVEL and an input 108' that may receive the processed signal i4×4_IDX. The circuit 122 may also have an output 150 that may present the signal PARSED_TOTAL_COEFF, an output 152 that may present the signal PARSED_TOTAL_ZEROS, an output 154 that may present the signal TOTAL_ZEROS_GT0, an output 156 that may present the signal PARSED_RUN_BEFORE_P1, and an output 158 that may present the signal SCANNING_POS_CMD. The circuit 122 may also have an output 160 that may present a signal (e.g., SIGNIFICANT_COEFF_CMD), an output 161 that may present a signal (e.g., PARSER_DONE), an output 162 that may present the signal i4×4_IDX, an output 164 that may present a signal (e.g., COEFF_CMD), an output 166 that may present a signal (e.g., PARSED_COEFF), and an output 168 that may present a signal (e.g., NON_ZERO_COEFF_COUNT_M1).

The circuit 124 may have an input 170 that may receive the signal SIGNIFICANT_COEFF_CMD, an input 172 that may receive the signal SCANNING_POS_D[3:0], an input 174 that may receive the signal SCANNING_POS_Q[3:0], an input 176 that may receive the signal TOTAL_ZEROS_GT0, an input 178 that may receive the signal PARSED_TOTAL_COEFF, an input 180 that may receive the signal PARSER_DONE, an input 182 that may receive the signal i4×4_IDX, an input 184 that may receive the signal COEFF_CMD, an input 186 that may receive the signal PARSED_COEFF, and an input 188 that may receive the signal NON_ZERO_COEFF_COUNT_M1.

The circuit 124 generally comprises a block (or circuit) 202, a block (or circuit) 204, a block (or circuit) 206, a block (or circuit) 208, and a circuit 210. The circuit 202 may be implemented as a logic circuit. In one implementation, the logic circuit 202 may be implemented as a 64-entry CABAC next coefficient scanning position determination logic circuit. In one example, the circuit 204 may be implemented as a flag generation circuit. In one implementation, the flag generation circuit 204 may be implemented as a significant coefficient flag generation circuit. In one example, the circuit 206 may be implemented as a state machine. In one implementation, the circuit 206 may be implemented as a finite state machine (FSM). The state machine 206 may be implemented to convert integer coefficient values to BIN values. In one example, the state machine 206 may implement concatenated unary/k-th order exponential binarization rules. In one example, the circuit 208 may be implemented as a sparse coefficient level re-ordering circuit. In one example, the circuit 210 may be implemented as a multiplexer circuit. In one implementation, the multiplexer circuit 210 may have 64 inputs that may be controlled by the signal NEXT_SCANNING_POS. The multiplexer 210 may present a signal COEFF. The state machine 206 may generate the output signal CABAC_BIN. The details of the circuit 120, the circuit 122, the circuit 202, the circuit 204, the circuit 206, the circuit 208 and the circuit 210 will be described in more detail in connection with FIGS. 4-7.

Figure 4:
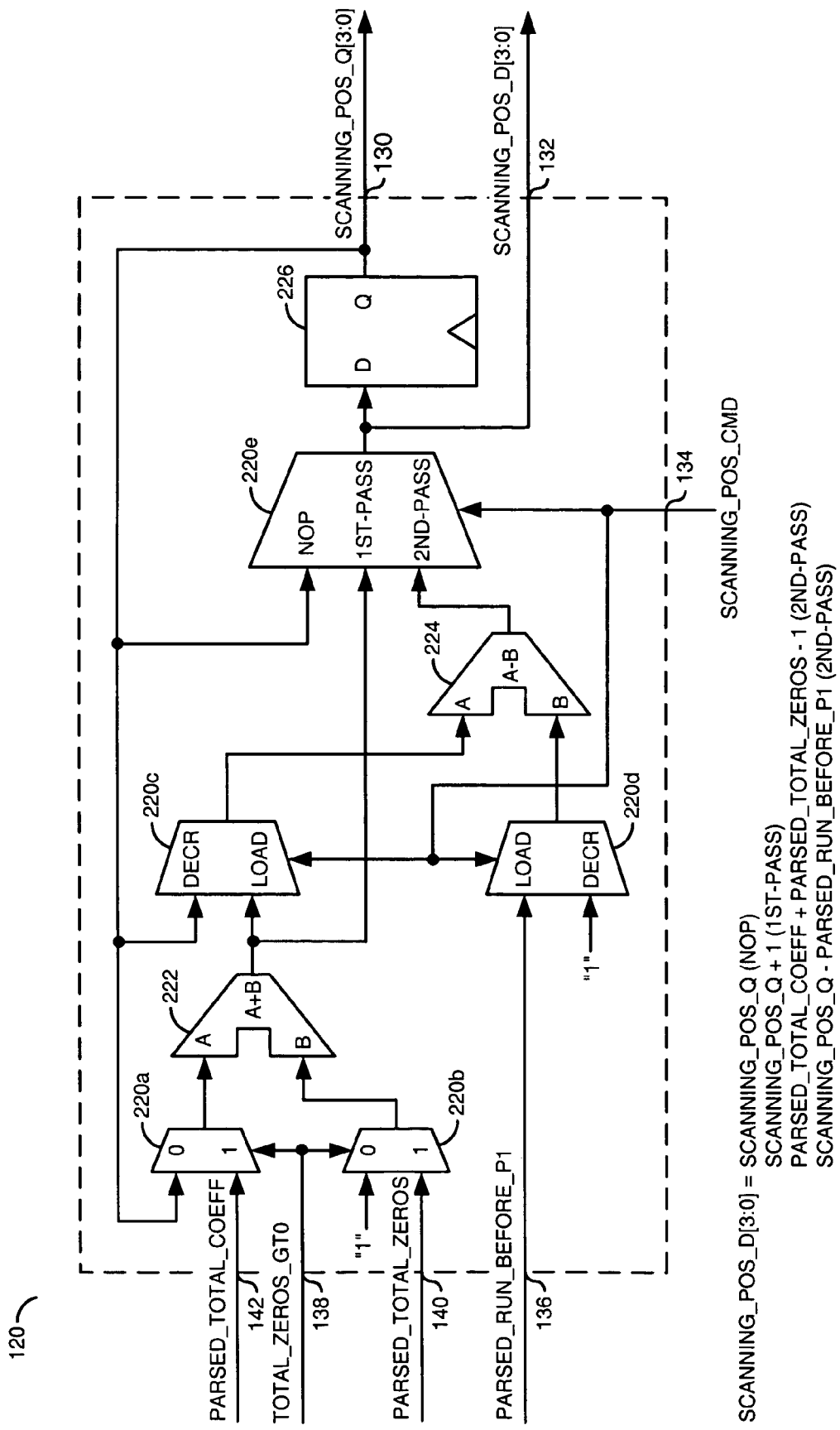
FIG. 4 is a block diagram of a coefficient scanning position determination logic.

Referring to FIG. 4, a more detailed diagram of the circuit 120 is shown. The circuit 120 generally comprises a number of multiplexers 220a-220e, an adder 222, a subtractor 224 and a memory element 226. In general, the multiplexers 220a-220d may be implemented as 2:1 multiplexers. The multiplexer 220e may be implemented as 3:1 multiplexer. In general, the adder 222 may add an input A (that receives an output of the multiplexer 220a) to an input B (that receives an output of the multiplexer 220b). The subtractor 224 may be implemented to subtract an input B (that receives an output from the multiplexer 220d) from an input A (that receives an output from the multiplexer 220c). The memory element 226 may be implemented as a multiple D type flip-flops. The memory element 226 may generate the signal SCANNING_POS_Q[3:0] in response to the input received from the multiplexer 220e. The multiplexer 220e may present an input to the memory element 226 in response to an input that may receive the signal SCANNING_POS_Q [3:0], an input that may receive a signal from the adder 222, or an input that may receive a signal from the subtractor 224. The multiplexer 220e presents an output signal in response to a select input that may receive the signal SCANNING_POS_CMD.

Figure 5A:
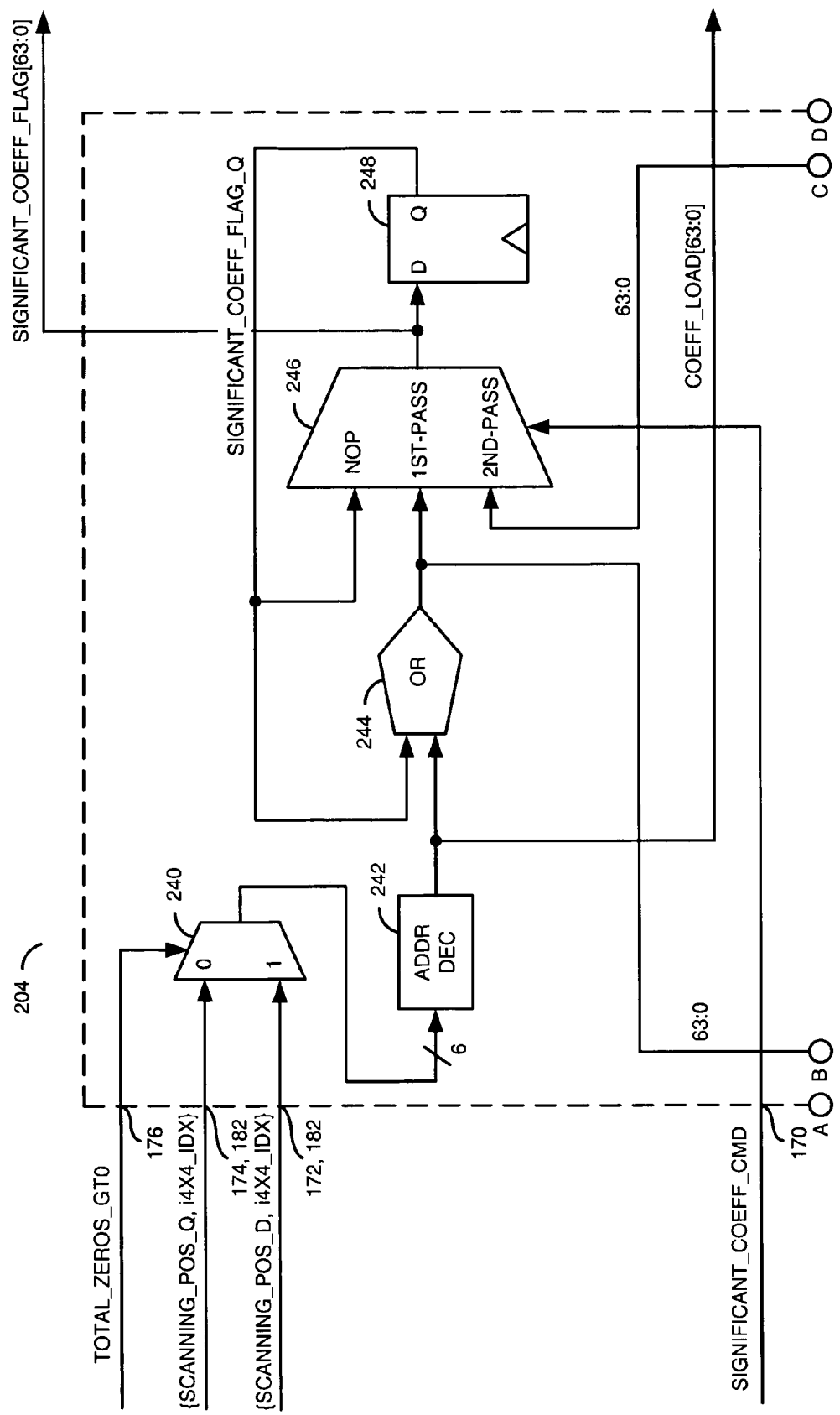
FIGS. 5A and 5B are a block diagram of the significant coefficient flag generation circuit.
Figure 5B:
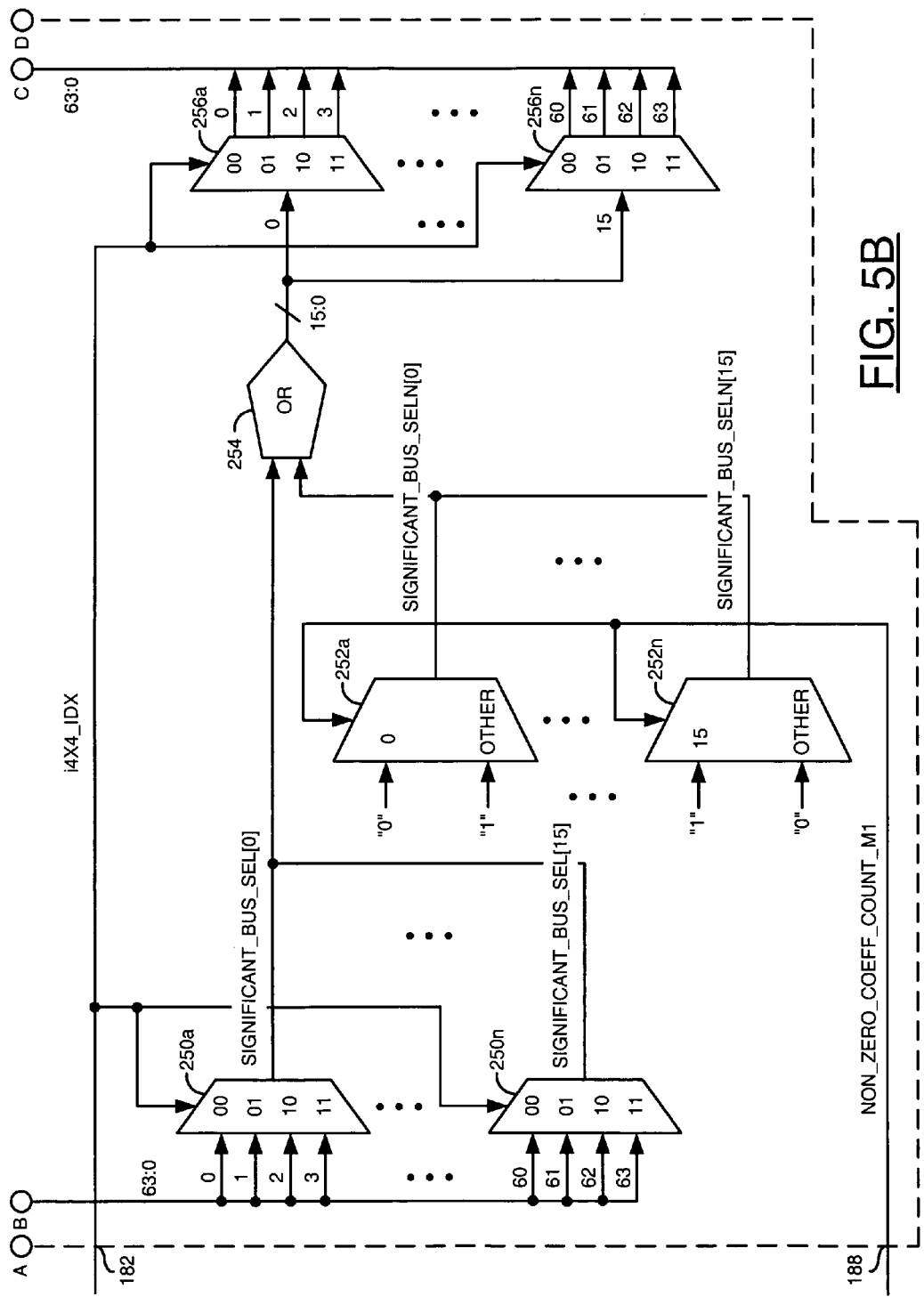

Referring to FIGS. 5A and 5B, a more detailed diagram of the coefficient flag generation circuit 204 is shown. The circuit 204 generally comprises a circuit 240, a circuit 242, a circuit 244, a circuit 246, a circuit 248, a number of circuits 250a-250n, a number of circuits 252a-252n, a circuit 254, and a number of circuits 256a-256n. The circuit 240 may be implemented as a multiplexer circuit. The circuit 242 may be implemented as a 6 to 64 address decoder circuit. The circuit 244 may be implemented as a gate, such as a 64-bit OR gate. The circuit 246 may be implemented as a multiplexer circuit. The circuit 248 may be implemented as a shift register array comprising multiple D type flip-flops. The circuits 250a-250n may be implemented as de-multiplexer circuits. The circuits 252a-252n may be implemented as multiplexer circuits. The circuit 254 may be implemented as a gate, such as a 16-bit OR gate. The circuits 256a-256n may be implemented as multiplexer circuits.

The circuit 240 may have a first input (e.g., input 0) that may, in parallel, receive the signal SCANNING_POS_Q and the signal i4×4 IDX, and an input (e.g., input 1) that may, in parallel, receive the signal SCANNING_POS_D and the signal i4×4_IDX. The circuit 240 may present an output in response to a select input that may receive the signal TOTAL_ZEROS_GT0. The output of the circuit 240 may be presented to an input of the circuit 242.

While the input of the circuit 242 is shown as a 6-bit input, a particular bit width may be varied to meet the design criteria of a particular implementation. An output of the circuit 242 COEFF_LOAD[63:0] may be presented to an input of the circuit 244 as well as to an input of the circuit 208.

The circuit 244 may present a signal to an input (e.g., 1ST-PASS) of the circuit 246. The circuit 246 may also have an input (e.g., NOP) that may receive a signal from the circuit 248. The circuit 246 may also have an input (e.g., 2nd-PASS that may receive a signal from the circuit 256a-256n. The circuit 246 selects either the input NOP, the input 1ST-PASS or the input 2ND-PASS in response to the signal SIGNIFICANT_COEFF_CMD received at the select input. The circuit 246 presents the signal SIGNIFICANT_COEFF_FLAG[63:0].

The circuits 250a-250n may be controlled by the signal i4×4_IDX. The circuits 252a-252n may be controlled by the signal NON_ZERO_COEFF_COUNT_M1. The circuits 256a-256n may be controlled by the signal i4×4_IDX.

Figure 6:
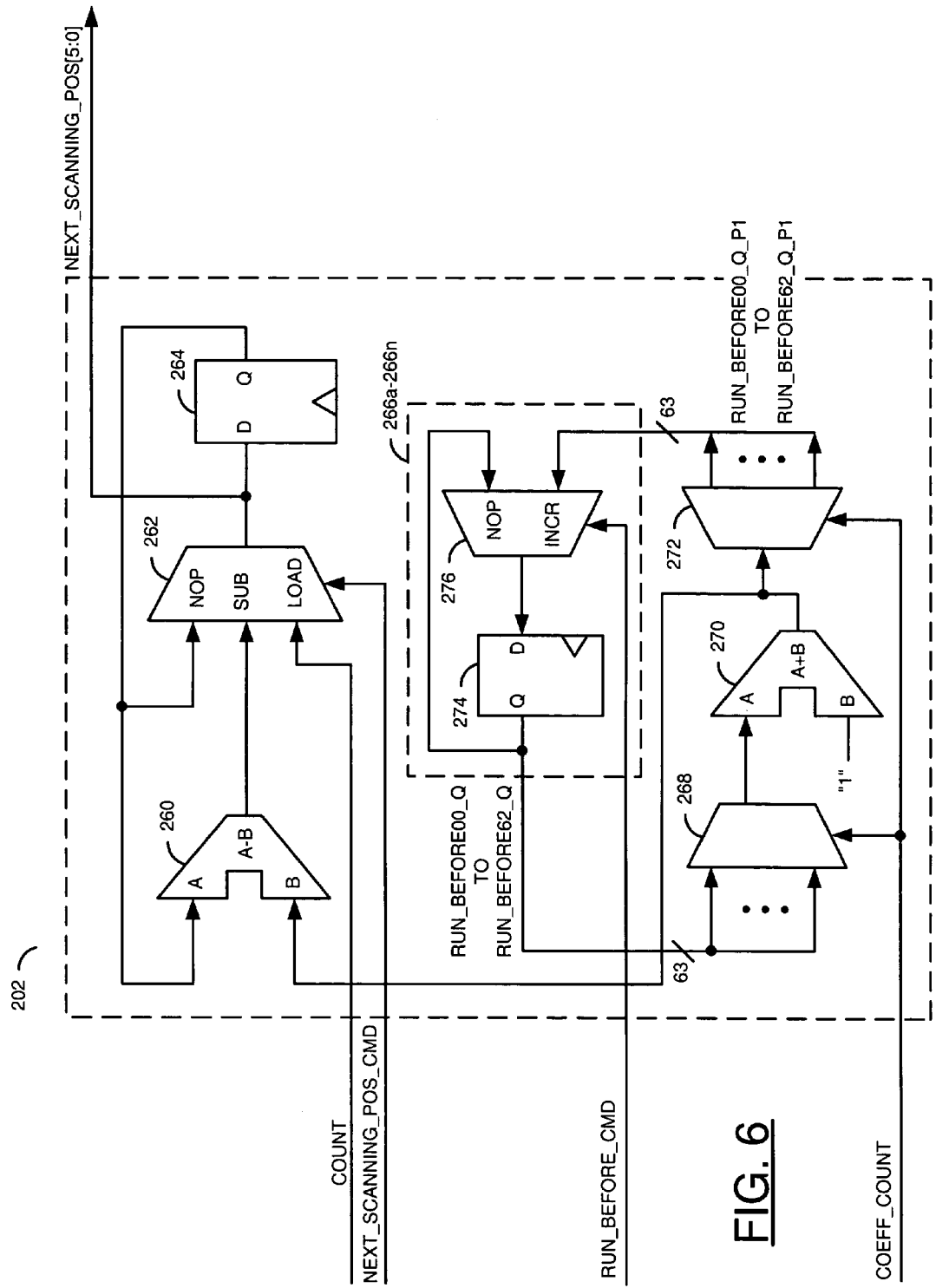
FIG. 6 is a block diagram of the next coefficient scanning position determination logic.

Referring to FIG. 6, a more detailed diagram of the next coefficient scannings logic is shown. The logic 202 generally comprises a circuit 260, a circuit 262, a circuit 264, a number of circuits 266a-266n, a circuit 268, a circuit 270 and a circuit 272. Each of the circuits 266a-266n may be implemented as a circuit 274 and a circuit 276. In the example shown, 63 instances of the circuits 266a-266n are implemented. However, the particular number of instances of the circuit 266a-266n may be varied to meet he design criteria of a particular implementation. In one example, the circuit 260 may be a subtractor circuit. The circuit 260 may subtract a second input (e.g., input B) from a first input (e.g., input A) to present an output signal (e.g., A-B). In one example, the circuit 262 may be implemented as a multiplexer. In the example shown, the circuit 262 may be implemented as a 3:1 multiplexer. A first input (e.g., NOP) may receive the output of the circuit 264, a second input (e.g., SUB) may receive the signal A-B and a third input (e.g., LOAD) may receive a signal COUNT. A select input may receive the signal NEXT_SCANNING_POS_CMD.

The circuit 264 may be implemented as a register. In one example, the circuit 264 may be implemented as a number of D type flip-flops. However, other flip-flop types may be implemented to make a design criteria of a particular implementation. An input (e.g., D) of the circuit 264 may receive an output from the multiplexer 262. The circuit 274 may be implemented as a D type register. The circuit 274 may receive a signal from circuit 276 and may present a signal to an output (e.g., Q). The circuit 276 may have an input (e.g., NOP) that may receive a signal from the Q output of the circuit 266 as well as an input (e.g., INCR) that may receive a signal from the circuit 272. The value from the signal RUN_BEFORE_CMD may be used as a control input to select either the input NOP or the input INCR. The Q output of the circuit 274 may also be presented to an input of the circuit 268. While 63 inputs are shown presented to the circuit 268, the particular number of inputs presented to the circuit 268 may be varied to meet the design criteria of a particular implementation. In general, each instance of the circuits 266a-266n presents one of the 63 inputs to the circuit 268.

The circuit 268 may present a signal to an input (e.g., input A) of the circuit 270. An input (e.g., input B) of the circuit 270 generally receives a digital "1". The circuit 270 presents a summation signal (e.g., A+B) to the circuit 272 as well as to the input B of the circuit 260. The circuit 272 has a select input controlled by the signal COEFF_COUNT. The circuit 272 may be implemented as a demultiplexer circuit. The demultiplexer circuit 274 may present a number (e.g., 63) of output signals. The demultiplexer circuit 272 may also be controlled by the signal COEFF_COUNT. The demultiplexer circuit 272 may present one input to each of the instances of the circuit 276.

Figure 7:
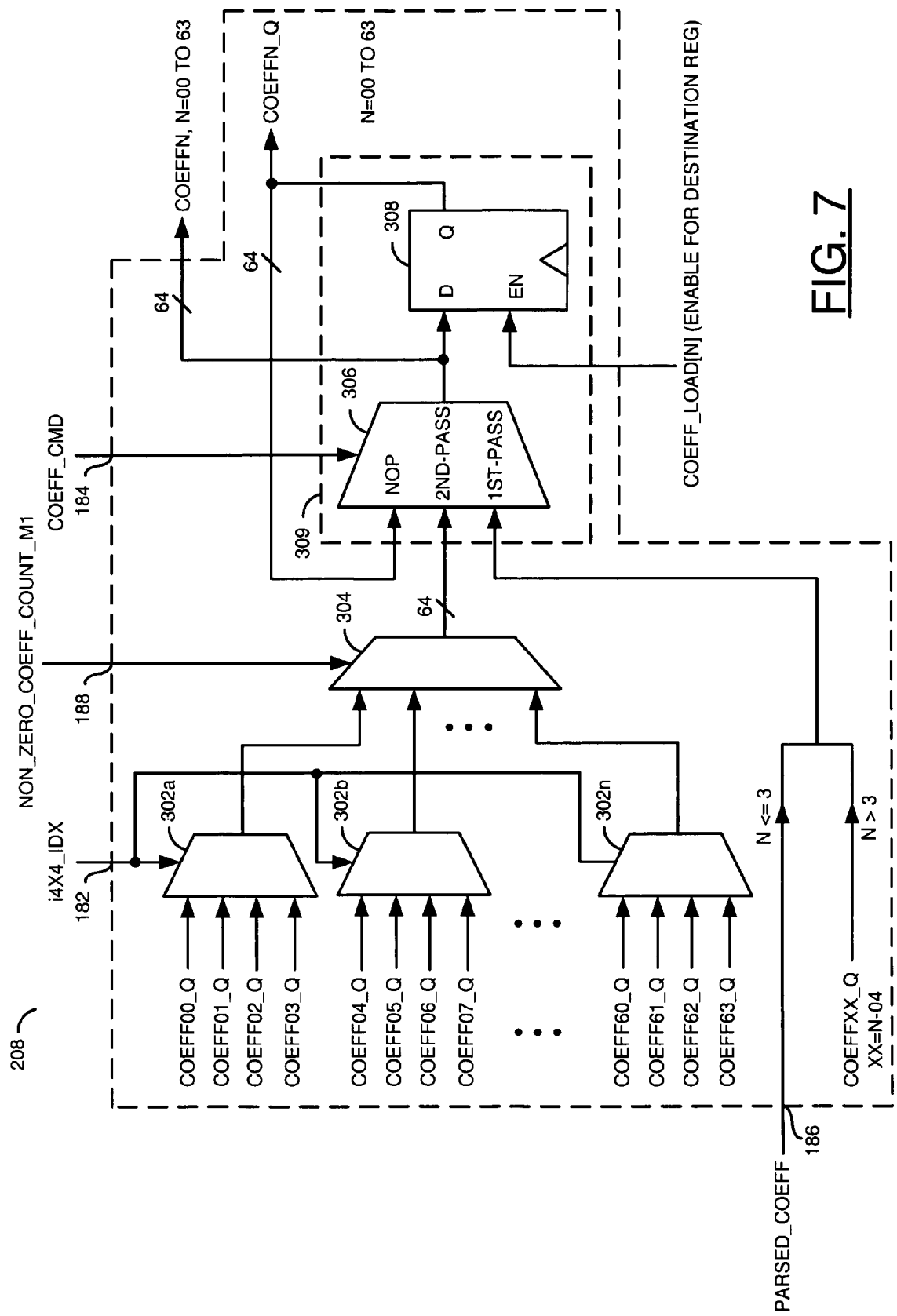
FIG. 7 is a block diagram of a sparse coefficient level re-ordering circuit.

Referring to FIG. 7, a more detailed diagram of the sparse coefficient level re-ordering circuit is shown. The circuit 208 generally comprises the number of multiplexers 302a-302n, a multiplexer 304, a multiplexer 306 and a memory circuit 308. A circuit 309 represents a number of instances of the circuit 306 and the circuit 308. The multiplexer 302a may receive a first group of signals COEFF00_Q, COEFF01_Q, COEFF02_Q and COEFF03_Q. The multiplexer 302b may receive a second group of signals COEFF04_Q, COEFF05_Q, COEFF06_Q and COEFF07_Q. Similarly, the multiplexer 302n may receive a number of signals COEFF60_Q, COEFF61_Q, COEFF62_Q and COEFF63_Q. If the multiplexers 302a-302n are implemented as 4:1 multiplexers, then 16 multiplexers may be needed to handle the 64 signals COEFF00 to COEFF63. If more signals COEFF00 to COEFF63 are needed, then more multiplexers 302a-302n may be implemented. In one example, each of the signals COEFF00 to COEFF63 may be implemented as 18-bit signals. However, other bit widths may be implemented to meet the design criteria of a particular implementation.

The multiplexer 304 selects an output from one of the multiplexers 302a-302n and presents an input (e.g., 2ND-PASS) of the circuit 306. The circuit 304 has a select input controlled by the signal NON_ZERO_COEFF_COUNT_M1. The circuit 306 may have an input (e.g., NOP) that may receive the output from circuit 308. An input (e.g., 1ST-PASS) that may receive either the signal PARSED_COEFF or one of the signals COEFFXX_Q. The signal PARSED_COEFF is normally presented for the first four instances (e.g., N<=3). The value COEFFXX_Q is normally presented for instances 04 to 63 of the circuit 309.

Each instance of the circuit 306 may have a select input controlled by the signal COEFF_CMD. The circuit 306 may present a signal (e.g. COEFF). The memory element 308 may be implemented as multiple D type memory element. The memory element 308 may generate the signal COEFF_Q in response to an input received from the multiplexer 306 and an input (e.g., EN) received by the signal COEFF_LOAD. The multiple instances of the circuit 308 may be configured as a 64-entry coefficient array (e.g., N= 0 . . . 63). The array generally comprises 4 shift registers each comprising a 16-entry array. For each shift register I=0 to 3, the coefficient entries correspond to positions I+4*K for K=0 to 15 within the 64-entry coefficient array.

The present invention may provide a method by which four 4×4 CAVLC residual blocks of transform coefficient levels are transcoded into an 8×8 CABAC residual block of transform coefficient levels without loss of performance or an increase in area. This is accomplished by generating a first pass CABAC calculation (e.g., the signal SIGNIFI-CANT_COEFF_FLAG) array and the signal COEFF during parsing of the signal TRAILING_ONES and the signal COEFF_LEVEL by the circuit 122. The second pass calculation is normally only performed if the value in the signal TOTAL_ZEROS is greater than zero. The signal SIGNIFI-CANT_COEFF_FLAG and the signal COEFF are re-ordered by the circuit 124 during the parsing stage of the signal RUN_BEFORE by the circuit 122. The parsed coefficients are shifted in from the least numbered position side in the corresponding shift register I of the circuit 308. If a 4×4 CAVLC block has a value in the signal TOTAL_ZEROS of zero, then the first pass arrays of the signals COEFF and the signal SIGNIFICANT_COEFF_FLAGS are generated. Otherwise, a second pass of re-ordering for the signal COEFF and the signal SIGNIFICANT_COEFF_FLAGS are performed by the circuit 124 during the parsing stage of the CAVLC signal RUN_BEFORE by the circuit 122. The bits of the signals SIGNIFICANT_COEFF_FLAG and COEFF are normally re-ordered and ready as output signals when the parsing of the 4×4 CAVLC is complete. The parsing and the reordering are implemented simultaneously.

In general, the present invention may be implemented without loss of performance. Very little, if any, extra hardware may be used to implement the present invention. While the present invention is preferably implemented using dedicated hardware, a general purpose CPU may also be used. A general purpose CPU may be slower than direct hardware implementation. The present invention may present a hardware implementation where the 8×8 CABAC residual block of transform coefficient levels are up-sampled after all of the four 4×4 CAVLC residual blocks are parsed. This approach generally incurs latency and thus performance is not maintained.

A hardware implementation where the 8×8 CABAC residual block of transform coefficient levels are up-sampled during parsing of the last syntax of the last 4×4 CAVLC residual block. This approach incurs hardware area and hence the cost of the IP is increased.

An H.264 transcode from CAVLC residual block to CABAC equivalent involves parsing the syntax of the CAVLC residual block and converting the transform coefficient levels into CABAC syntax. For a 4×4 transcode, the CAVLC residual block syntax is normally transcoded (parsed) into CABAC syntax without a need for altering/re-ordering the positions of the transform coefficient levels. For a 8×8 transcode, four 4×4 CAVLC blocks of transform coefficient levels are re-ordered (parsed and up-sampled) according to H.264 standard to yield an 8×8 CABAC residual block. The up-sampling step may use knowledge of the absolute position of the transform coefficient levels within the 4×4 CAVLC residual blocks. A straightforward approach may be to break the transcode operation into two stages 1) parsing stage and 2) up-sampling stage when the positions of the transform coefficient levels are known. However, with this approach, latency is incurred by the up-sampling stage.

The operation of the 8×8 CABAC transcoding is shown in FIGS. 1-7. The signal i4×4_IDX may carry a 4×4 block index number that ranges from 0 to 3. The signal NON_ZE-RO_COEFF_COUNT_M1[4:0] may carry an up/down count value configured to count up the number of non-zero coefficients minus 1 in the 4×4 array during a parsing of the signals TRAILING_ONES and COEFF_LEVEL. The signal NON_ZERO_COEFF_COUNT_M1[4:0] may be a count signal configured to count down during a parsing of the signal RUN_BEFORE. The signal COEFF_COUNT[5:0] may be implemented as an up/down counting signal that (i) counts up the number of ones during an encoding of the signal SIGNIFICANT_COEFF_FLAG by the circuit 110 and (ii) counts down during an encoding of the signals TRAILING_ONES and COEFF_LEVEL by the circuit 110. The signal COUNT[5:0] may be implemented as an up/down count signal configured to count up from zero to the last scanning position of the non-zero coefficient in the 8×8 array during the encoding of the signal SIGNIFICANT_COEFF_FLAG by the circuit 110. The signal COUNT[5:0] may be a count signal configured to count down during the encoding of the signal COEFF. The signal NEXT_SCAN-NING_POS[5:0] may be based on the signal RUN_BE-FORE values of the encoded 8×8 CABAC residual block that are created during an output encoding of the signal SIGNIFICANT_COEFF_FLAG. The signal NEXT_SCAN-NING_POS[5:0] may specify the scanning position of the next coefficient level to be output. The signals SCANNING_POS_Q[3:0] and SCANNING_POS_D[3:0] may be used to generate an array of the signal SIGNIFICANT_COEFF_FLAG. The signal LAST_SIGNIFICANT_COEFF_FLAG may be generated from the signal COEFF_COUNT when the signal SIGNIFICANT_COEFF_FLAG is presented.

Referring back to FIGS. 5 and 7, during the first pass shifting, the following operations may be performed. When the signal i4×4_IDX=0 (e.g., a first 4×4 CAVLC residual block), the signal COEFF_LEVEL may be shifted into the circuit 308 (of FIG. 7), defined by indices 0, 4, 8, 12, . . . , 60. The new parsed signal PARSED_COEFF is shifted into a reg 0, the output of the reg 0 is shifted into a reg 4, the output of the reg 4 shifted into a reg 8, etc. Simultaneously, the signal SIGNIFICANT_COEFF_FLAG array entries 0, 4, 8, 12, . . . , 60 may be set in the circuit 248 (FIG. 5).

When the signal i4×4_IDX=1 (e.g., a second 4×4 CAVLC residual block), the signal PARSED_COEFF is shifted into the circuit 308 defined by indices 1, 5, 9, 13, . . . , 61. The new parsed signal PARSED_COEFF is shifted into a reg 1, the output of the reg 1 is shifted into a reg 5, the output of the reg 5 shifted into a reg 9, etc. Simultaneously, the signal SIGNIFICANT_COEFF_FLAG array entries 1, 5, 9, 13, . . . , 61 may be set in the circuit 248.

When the signal i4×4_IDX=2 (e.g., a third 4×4 CAVLC residual block), the signal COEFF_LEVEL is shifted into the shift register array 308 defined by indices 2, 6, 10, 14, . . . , 62. The new parsed signal PARSED_COEFF is shifted into a reg 2, output of reg the 2 is shifted into a reg 6, output of the reg 6 shifted into a reg 10, etc. Simultaneously, the signal SIGNIFICANT_COEFF_FLAG array entries 2, 6, 10, 14, . . . , 62 may be set in the circuit 248.

When the signal i4×4_IDX=3 (e.g., a fourth 4×4 CAVLC residual block), the signal PARSED_COEFF is shifted into the shift register array 308 defined by indices 3, 7, 11, 15, . . . , 63. The new parsed signal PARSED_COEFF is shifted into a reg 3, output of the reg 3 is shifted into a reg 7, output of the reg 7 shifted into a reg 11, etc. Simultaneously, the signal SIGNIFICANT_COEFF_FLAG array entries 3, 7, 11, 15, . . . , 63 may be set in the circuit 248.

Referring back to FIGS. 3-7, second pass re-ordering is normally performed only when the signal TOTAL_ZEROS for the 4×4 CAVLC residual block has a value greater than zero. Based on the signal TOTAL_COEFF, the signal TOTAL_ZEROS and the signal RUN_BEFORE for the 4×4 residual block, the appropriate array entries of the signal SIGNIFICANT_COEFF_FLAG and the signal COEFF may be re-ordered. The following example explains how the re-ordering is performed.

If the signal i4×4_IDX=0, PARSED_TOTAL_COEFF=5, PARSED_TOTAL_ZEROS=10, RUN_BEFORE04=7 (PARSED RUN_BEFORE P1=8) (FIG. 3) and RUN_BE-FORE02=1 (PARSED_RUN_BEFORE P1=2 (of FIG. 3)

1 st-Pass:

The values of the signal PARSED_COEFF may be shifted into the registers 0, 4, 8, 12 and 16 of the shift register array 308; and The values of the signal SIGNIFICANT_COEFF_FLAG in the registers 0, 4, 8, 12 and 16 of the circuit 248 are set.

2nd-Pass:

The values in the signal SCANNING_POS_D may be loaded into the circuit 242 with the values of the signals PARSED_TOTAL_COEFF+PARSED_TOTAL_ZEROS−1=d'14;

A source register index to read from the circuits 248 and 308=16; and

A destination register index to write into the circuits 248 and 208={SCANNING_POS_D, i4×4_IDX}=d'56.

As such, the signal COEFF at index 16 is moved to index 56 within the circuit 308.

When the signal RUN_BEFORE is parsed (RUN_BE-FORE04=7) (e.g., PARSED_RUN_BEFORE_P1=8:

The signal SCANNING_POS_D is loaded with the values of the signals SCANNING_POS_Q−PARSED_RUN_BE-FORE_P1=14−8=d'6;

The source register index=12; and

The destination register index={SCANNING_POS_D, i4×4_IDX}=d'24.

When the next run_before is parsed (e.g., RUN_BE-FORE02=1 and PARSED_RUN_BEFORE_P1=2):

The signal SCANNING_POS_D is loaded with the value of the signals SCANNING_POS_Q−PARSED_RUN_BE-FORE_P1=6−2=d'4;

The source register index=8; and
The destination register index={SCANNING_POS_D, i4x4_IDX}=d'16.

For the signal SIGNIFICANT_COEFF_FLAG, the source flag setting obtained during 1st-Pass are reset to zeros. The re-ordered flag bit setting is based on the same technique described for the coefficients. There are two corner scenarios that should be handled by the circuit 208 (of FIG. 3).

The first corner case occurs when there is a single value for the signal COEFF_LEVEL in the 4×4 residual block.
When i4x4_IDX=0:
SIGNIFICANT_COEFF_FLAG=COEFF_LOAD.
When i4x4_IDX=1 to 3:
SIGNIFICANT_COEFF_FLAG= SIGNIFICANT_COEFF_FLAG_Q; and
SIGNIFICANT_COEFF_FLAG [i4x4_IDX+4*i]=COEFF_LOAD[i4x4_IDX+4*i], for i=0 to 15.

The second corner case occurs when the signal PARSED_TOTAL_ZEROS−(sum of all the signal RUN_BEFORE)=0 and the signal NON_ZERO_COEFF_COUNT_M1 is greater than 0. In this case, multiple flag bits should be set simultaneously, such as:
SIGNIFICANT_COEFF_FLAG[i4x4_IDX+4*i]=1, for i=0 to NON_ZERO_COEFF_COUNT_M1.

The function performed by the diagrams of FIGS. 1-7 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, magneto-optical disks, ROMs, RAMs, EPROMS, EEPROMS, Flash memory, magnetic or optical cards, or any type of media suitable for storing electronic instructions. As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the scope of the invention.

The invention claimed is:

1. A circuit comprising:
a first module configured to (i) generate a plurality of parsed residual blocks by parsing a plurality of 4×4 CAVLC (context-based adaptive variable length coding) residual blocks received in an input signal and (ii) generate a plurality of metric signals resulting from said parsing of said 4×4 CAVLC residual blocks;
a second module configured to generate a plurality of scanning position signals based on said metric signals; and
a third module configured to generating an 8×8 CABAC (context-based adaptive binary arithmetic coding) residual block in an output signal by up-sampling said parsed residual blocks based on said scanning position signals.

2. The circuit according to claim 1, wherein said third module comprises a fourth module configured to generate an array of significant coefficient flags during said parsing of a trailing ones syntax and a coefficient level syntax element of said input signal.

3. The circuit according to claim 2, wherein said first module is further configured to receive a value in said input signal of a number of zero-valued transform coefficient levels located before a position of a last non-zero transform coefficient level.

4. The circuit according to claim 3, wherein said third module further comprises a fifth module configured to reorder said array where said value is greater than zero.

5. The circuit according to claim 4, wherein said array is reordered during said parsing of a run_before syntax element of said input signal.

6. The circuit according to claim 4, wherein said third module further comprises a sixth module configured to reorder said parsed residual blocks where said value is greater than zero.

7. The circuit according to claim 6, wherein said parsed residual blocks are reordered during said parsing of a run_before syntax element of said input signal.

8. The circuit according to claim 6, wherein said third module is further configured to generate said output signal based on said array and said parsed residual blocks where said value is zero.

9. The circuit according to claim 6, wherein said third module is further configured to generate said output signal based on said array as reordered and said parsed residual blocks as reordered where said value is greater than zero.

10. The circuit according to claim 1, further comprising an arithmetic encoder configured to generate a bitstream by encoding said output signal, wherein said bitstream is compliant with an H.264 recommendation High 10 profile.

11. A method for 8×8 context-based adaptive binary arithmetic coding (CABAC) residual block transcoding, comprising the steps of:
(A) generating a plurality of parsed residual blocks by parsing a plurality of 4×4 CAVLC (context-based adaptive variable length coding) residual blocks received in an input signal;
(B) generating a plurality of metric signals resulting from said parsing of said 4×4 CAVLC residual blocks;
(C) generating a plurality of scanning position signals based on said metric signals; and
(D) generating an 8×8 CABAC residual block in an output signal by up-sampling said parsed residual blocks based on said scanning position signals.

12. The method according to claim 11, wherein step (D) comprises the sub-step of:
generating an array of significant coefficient flags during said parsing of a trailing ones syntax element and a coefficient level syntax element of said input signal.

13. The method according to claim 12, further comprising the step of:
receiving a value in said input signal of a number of zero-valued transform coefficient levels located before a position of a last non-zero transform coefficient level.

14. The method according to claim 13, further comprising the step of:
   reordering said array where said value is greater than zero.

15. The method according to claim 14, wherein said array is reordered during said parsing of a run_before syntax element of said input signal.

16. The method according to claim 14, further comprising the step of:
   reordering said parsed residual blocks where said value is greater than zero.

17. The method according to claim 16, wherein said parsed residual blocks are reordered during said parsing of a run_before syntax element of said input signal.

18. The method according to claim 16, wherein step (D) comprises the sub-step of:
   generating said output signal based on said array and said parsed residual blocks where said value is zero.

19. The method according to claim 16, wherein step (D) comprises the sub-step of:
   generating said output signal based on said array as reordered and said parsed residual blocks as reordered where said value is greater than zero.

20. A device comprising:
   means for generating a plurality of parsed residual blocks by parsing a plurality of 4×4 CAVLC (context-based adaptive variable length coding) residual blocks received in an input signal;
   means for generating a plurality of metric signals resulting from said parsing of said 4×4 CAVLC residual blocks;
   means for generating a plurality of scanning position signals based on said metric signals; and
   means for generating an 8×8 CABAC (context-based adaptive binary arithmetic coding) residual block in an output signal by up-sampling said parsed residual blocks based on said scanning position signals.

* * * * *